(12) United States Patent
Klubek et al.

(10) Patent No.: US 7,553,558 B2
(45) Date of Patent: Jun. 30, 2009

(54) ELECTROLUMINESCENT DEVICE CONTAINING AN ANTHRACENE DERIVATIVE

(75) Inventors: Kevin P. Klubek, West Henrietta, NY (US); Denis Y. Kondakov, Kendall, NY (US)

(73) Assignee: Eastman Kodak Company, Rochester, NY (US)

( * ) Notice: Subject to any disclaimer, the term of this patent is extended or adjusted under 35 U.S.C. 154(b) by 615 days.

(21) Appl. No.: 11/289,856

(22) Filed: Nov. 30, 2005

(65) Prior Publication Data

US 2007/0122656 A1 May 31, 2007

(51) Int. Cl.
*H01L 51/54* (2006.01)
(52) U.S. Cl. .................. 428/690; 428/917; 313/504; 313/506
(58) Field of Classification Search .......... 313/504, 313/506
See application file for complete search history.

(56) References Cited

U.S. PATENT DOCUMENTS

| 2002/0168543 | A1* | 11/2002 | Ishikawa et al. | 428/690 |
|---|---|---|---|---|
| 2004/0018383 | A1* | 1/2004 | Aziz et al. | 428/690 |
| 2004/0209117 | A1 | 10/2004 | Aziz et al. | |
| 2004/0234809 | A1 | 11/2004 | Chen et al. | |
| 2004/0265628 | A1* | 12/2004 | Wang et al. | 428/690 |

FOREIGN PATENT DOCUMENTS

| EP | 1 341 403 | | 9/2003 |
|---|---|---|---|
| JP | 2003-115387 | | 4/2003 |
| JP | 2003-123983 | | 4/2003 |
| JP | 2003109765 | * | 4/2003 |
| JP | 2003-138251 | | 5/2003 |
| JP | 2003-146951 | | 5/2003 |
| JP | 2004-175691 | | 6/2004 |
| JP | 2004-311184 | | 11/2004 |
| WO | 2007018004 | | 2/2007 |

OTHER PUBLICATIONS

R. Wang, et al., "1-Methyl-2-(anthryl)-imidazo[4,5-f][1,10]-phenanthroline: A Highly Efficient Electron-Transport Compound and a Bright Blue-Light Emitter for Electroluminescent Devices", Advanced Functional Materials, 2005, pp. 1483-1487.
K. P. Klubek, et al, "Electroluminescent Device Containing a Phenanthroline Derivative", U.S. Appl. No. 11/290,214 ,(D-91885) filed Nov. 30, 2005.

\* cited by examiner

*Primary Examiner*—Dawn Garrett
(74) *Attorney, Agent, or Firm*—Arthur E. Kluegel

(57) ABSTRACT

An OLED device comprises a cathode, an anode, and a light-emitting layer therebetween, and additionally comprises a layer between the cathode and the light-emitting layer including a compound comprising one and only one anthracene nucleus bearing no more than two phenanthroline-containing substituents wherein said anthracene nucleus is substituted in the 2-, 3-, 6-, or 7-position with a phenanthroline-containing substituent. When such materials are included in a layer, such as an electron-transporting layer, that provide both desirable electroluminescent properties as well as good device stability.

9 Claims, 1 Drawing Sheet

ELECTROLUMINESCENT DEVICE CONTAINING AN ANTHRACENE DERIVATIVE

FIELD OF THE INVENTION

This invention relates to organic electroluminescent devices. More specifically, this invention relates to devices that emit light from a current-conducting organic layer. The device includes a layer containing a compound having one anthracene nucleus and bearing no more than two phenanthroline groups.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often greater than 100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layers and enabled devices to operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (J. Applied Physics, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

EL devices that emit white light have proven to be very useful. They can be used with color filters to produce full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices.

One of the most common materials used in many OLED devices is tris(8-quinolinolato)aluminum (III) (Alq). This metal complex is an excellent electron-transporting material and has been used for many years in the industry. However, it would be desirable to find new materials to replace Alq that would afford further improvements in electroluminescent device performance.

Substituted 1,10-phenanthroline compounds, such as the two listed below, are also described as useful electron-transporting materials in JP2003-115387; JP2004-311184; JP2001-267080; and WO 2002-043449. Additional phenanthroline compounds are reported in JP 2004-311184, JP 2004-175691, JP 2003-138251, JP 2003-123983, JP 2003-115387, EP 1341403, EP 564224, and WO 2004-026870.

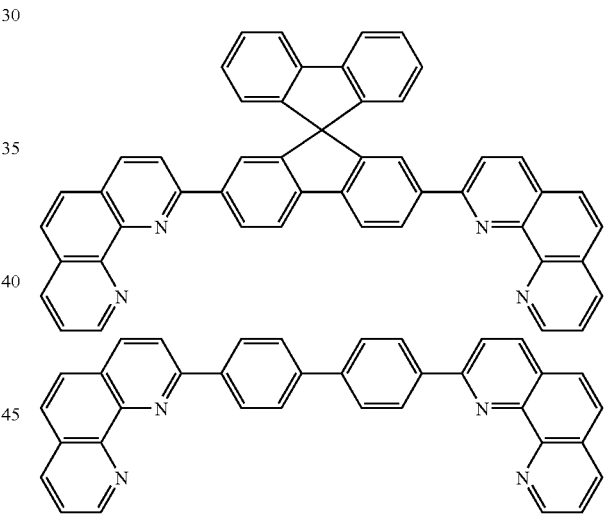

However, although some of these phenanthroline materials may provide increased luminance and reduced drive voltage in an OLED device, device lifetimes may be shorter than desired. Thus there continues to be a need for new materials, such as electron-transporting materials, that provide both desirable electroluminescent properties as well as good device stability.

SUMMARY OF THE INVENTION

The invention provides an OLED device comprising a cathode, an anode, and a light-emitting layer therebetween, and additionally comprises a layer between the cathode and the light-emitting layer including a compound comprising one and only one anthracene nucleus bearing no more than two phenanthroline-containing substituents wherein said anthracene nucleus is substituted in the 2-, 3-, 6-, or 7-position with a phenanthroline-containing substituent. When such materials are included in a layer, such as an electron-transporting layer, that provide both desirable electroluminescent properties as well as good device stability.

DETAILED DESCRIPTION OF THE INVENTION

Figure 1:
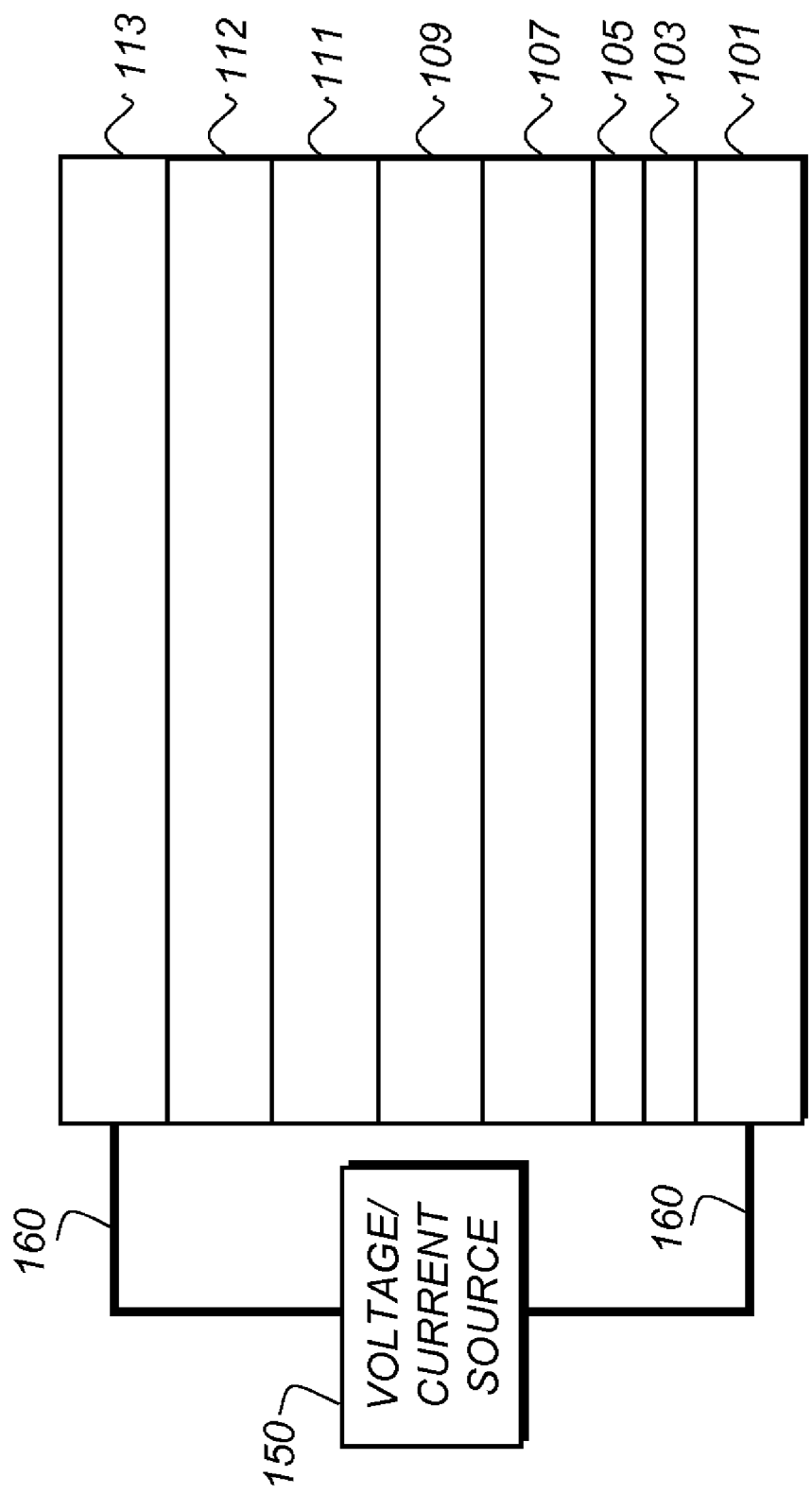
FIG. 1 shows a schematic cross-sectional view of an OLED device that represents one embodiment of the present invention.

The invention is generally described above. The invention provides an OLED device including an anode, a light-emitting layer, and a cathode. Between the cathode and the light-emitting layer is another layer containing a compound that includes one and only one anthracene nucleus and the anthracene nucleus bearing no more than two phenanthroline-containing substituents. In the case of two phenanthroline-containing substituents, the substituents may be the same or different. In any case, the anthracene nucleus is substituted in the 2-, 3-, 6-, or 7-position with at least one phenanthroline-containing substituent. In one embodiment, the compound includes one and only one phenanthroline-containing substituent.

The anthracene numbering system is shown below. In one desirable embodiment, the anthracene nucleus is further substituted in the 9- and 10-positions with independently selected aromatic groups, such as a phenyl group, a naphthyl group, or a biphenyl group.

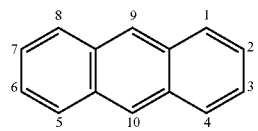

A phenanthroline group corresponds to a phenanthrene where each terminal ring has one non-fusion atom replaced by nitrogen. The location of the two nitrogen atoms is indicated by the appropriate number prefix, as illustrated below. In one embodiment, the phenanthroline-containing substituent is a 1',10'-phenanthroline derivative.

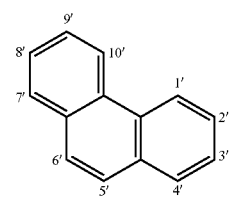

phenanthrene

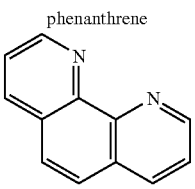

1', 10'-phenanthroline

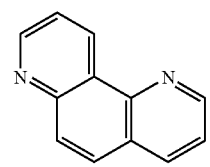

1', 7'-phenanthroline

The phenanthroline-containing substituent may be directly bonded to the anthracene nucleus or may be bonded by means of a linking group. A linking group is a divalent species that bonds to both the anthracene group and phenanthroline group. For instance, the linking group could be a divalent aromatic group, a divalent alkyl group, or a divalent heteroatom. Non-limiting examples of linking groups are shown below.

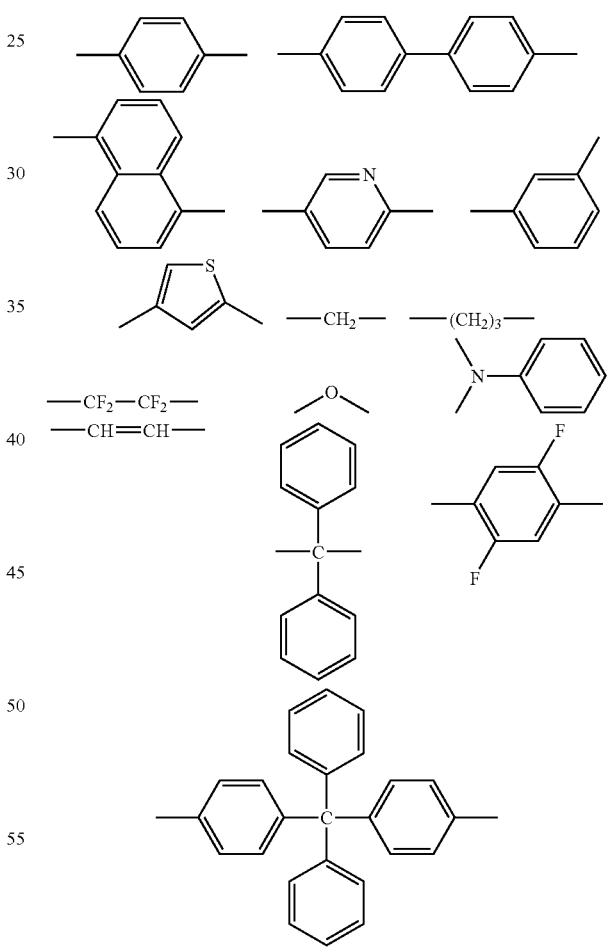

In one embodiment the anthracene compound is included in an electron-transporting layer. The compound may comprise 100% of the layer or there may be other components in the layer, in which case the anthracene compound may be present at a level of substantially less than 100% of the layer, for instance it may be present at 90% by volume, 80%, 70%, or 50% by volume, or even less. Desirably, when present, other components of the layer also have good electron-transporting properties.

Without being bound to any particular theory of how the invention works, it is believed that when the compound is used in a layer, such as an electron-transporting layer, under certain conditions both holes and electrons may enter the layer leading to recombination taking place and producing the excited state of the compound. In particular it is believed that the excited state of the phenanthroline portion of the compound is formed. Before the excited phenanthroline substituent can react further, possibly leading to decomposition, energy transfer occurs from the phenanthroline to the anthracene nucleus. The excited state of anthracene has lower energy and is relatively stable and unlikely to lead to destruction of the compound. The excited anthracene portion of the compound may return to the ground state by light emission or by a non-radiative process. Thus the inventive compound provides excellent electron-transporting properties due to the phenanthroline substituent but improved stability relative to other phenanthroline materials due to the presence of the anthracene nucleus.

In one aspect of the invention, the inventive compound is represented by Formula (1a) or Formula (1b).

In another suitable embodiment, L represents a bond, so that the anthracene nucleus is directly bonded to the phenanthroline nucleus. For example, the bond may be from the 2-position of the anthracene to the 2'-position of the phenanthroline.

In an alternative embodiment, L represents a divalent aromatic linking group, which may be further substituted, such as a phenylene group, a biphenylene group, or a naphthalene-1,4-diyl group. In alternative embodiments, L represents a divalent alkyl group or a divalent heteroatom.

In one further embodiment, the inventive compound is represented by Formula (1c) or Formula (1d). In the Formulae, $d^1$, $d^3$-$d^{10}$, $g^1$, m, n, p, r, s, and t have been described previously.

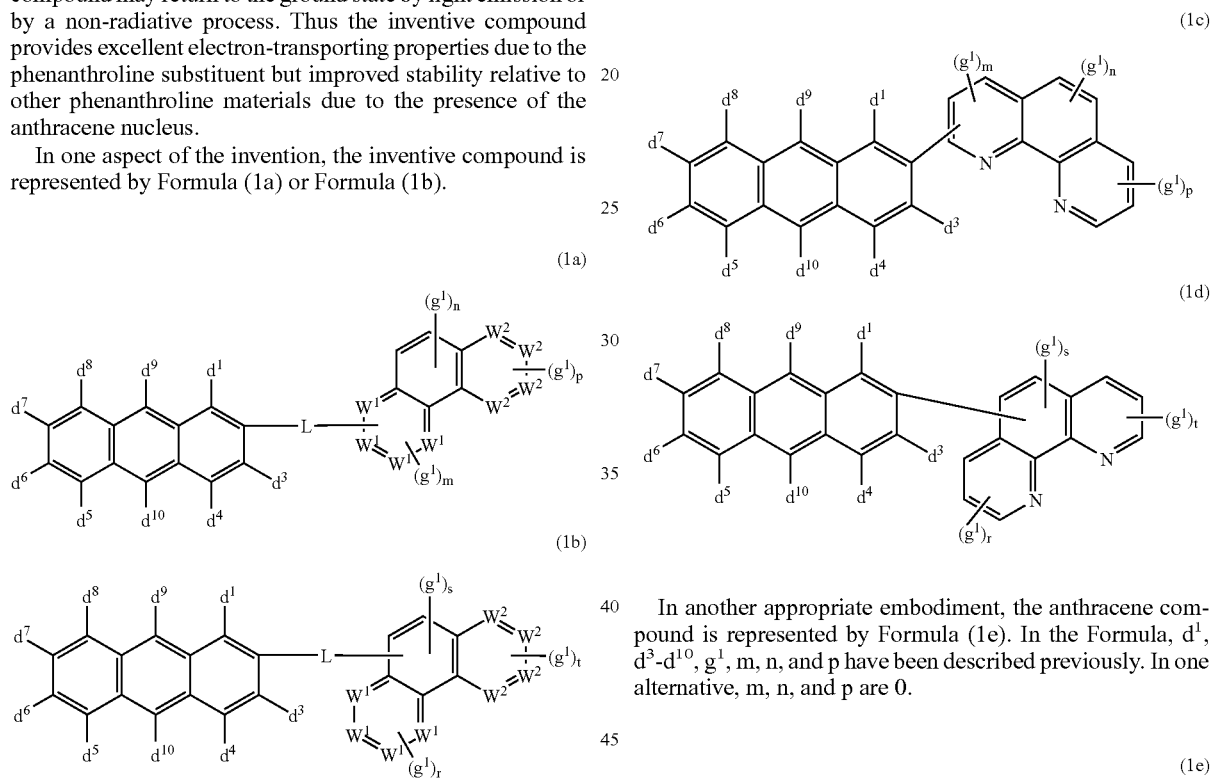

In Formula (1a) and Formula (1b), $d^1$ and $d^3$ through $d^{10}$ maybe the same or different and each represents hydrogen or an independently selected substituent, provided that two substituents may combine to form a fused ring.

In the Formulae, L represents a bond or a linking group. Linking groups have been described previously.

Each $W^1$ represents CH or N, provided one and only one of $W^1$ represents N. In like manner, each $W^2$ represents CH or N, provided one and only one of $W^2$ represents N.

Each $g^1$ may be the same or different and each represents an independently selected substituent, provided adjacent substituents may combine to form a ring. Examples of substituents include a fluoro substituent, a cyano substituent, and a phenyl group.

In the Formulae, m is 0-2; n is 0-2; p is 0-3; r is 0-3; s is 0 or 1; t is 0-3.

In one suitable embodiment, $d^9$ and $d^{10}$ represent aromatic groups, such as phenyl groups, naphthyl groups, or biphenyl groups.

In another appropriate embodiment, the anthracene compound is represented by Formula (1e). In the Formula, $d^1$, $d^3$-$d^{10}$, $g^1$, m, n, and p have been described previously. In one alternative, m, n, and p are 0.

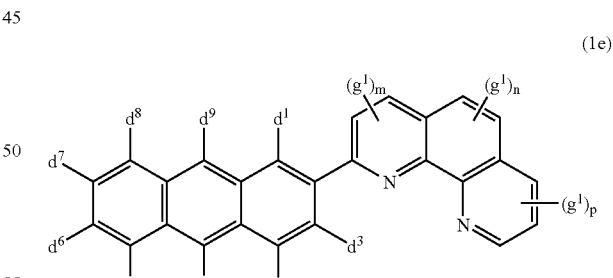

In a further aspect of the invention, the inventive compound includes one and only one anthracene nucleus and this nucleus is substituted with one and only one phenanthroline-containing substituent and provided the compound does not include a substituent including silicon.

In one embodiment, the anthracene nucleus is not substituted with a phenanthroline-containing substituent in the 9- or 10-positions. Desirably, the anthracene is further substituted in the 9- and 10-positions with independently selected aromatic groups, such as phenyl groups.

In another embodiment, the anthracene compound is represented by Formula (2).

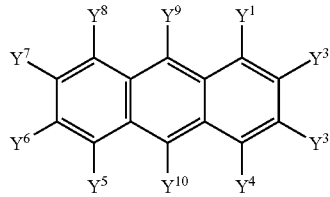
(2)

In Formula (2), $Y^1$ through $Y^{10}$ represent hydrogen or a substituent, provided one and only one of $Y^1$ through $Y^{10}$ is represented by Formula (2a) or (2b).

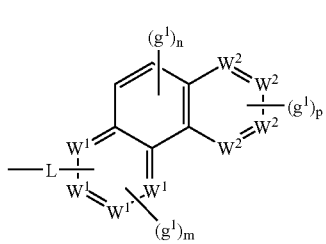
(2a)

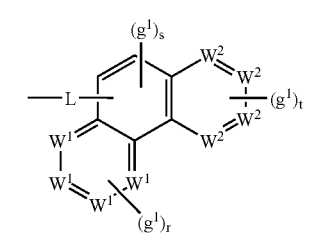
(2b)

In Formula (2a) and (2b), L, $W^1$, $W^2$, $g^1$, m, n, p, r, s, and t have been described previously.

Compounds of the present invention can be synthesized by various methods known in the literature or by modifications of these methods. For example, see M. Schmittel et al., *Org. Lett.*, 6(12), 1923 (2004), and *Eur. J. Inorg. Chem.*, 5, 1155 (2001), and also E. C. Riesgo et al., J. Org. Chem., 61(9), 3017 (1996). By way of illustration, particular materials of the present invention can be prepared using the Friedländer condensation as shown in Scheme 1 and as discussed by E. C. Riesgo et al. (*J. Org. Chem.*), 61, 3017-22, (1996). Int-C condenses with an anthracene derivative containing at least one ketone group in the presence of potassium hydroxide and ethanol to produce compounds of the present invention (Prod-1). Prod-1 may be further functionalized using various synthetic techniques to yield compounds with desirable properties.

The starting material, 8-amino-7-quinolinecarbaldehyde (Int-C) can be synthesized in 3 steps (scheme 2) as shown by Riesgo et al. In the first step, commercially available 7-methyl-8-nitroquinoline is condensed with N,N-dimethylformamide dimethyl acetal (DMFDMA) in dimethylformamide (DMF) to produce N,N-dimethyl-2-(8-nitro-7-quinolinyl)-ethenamine (Int-A). Int-A is then oxidized using sodium periodate in 50% aqueous tetrahydrofuran (THF) to produce 8-nitro-7-quinolinecarbaldehyde (Int-B). Int-B is then reduced using iron powder, HCl, and a mixture of ethanol, acetic acid and water to produce 8-amino-7-quinolinecarbaldehyde (Int-3). Anthracene derivatives containing at least one ketone group are either commercially available or can be synthesized by one skilled in the art.

Scheme 1

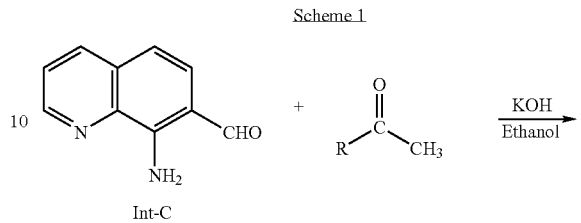

Int-C

R = anthracene derivative

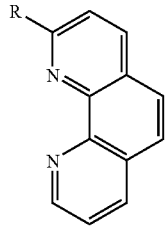

Prod-1

Scheme 2

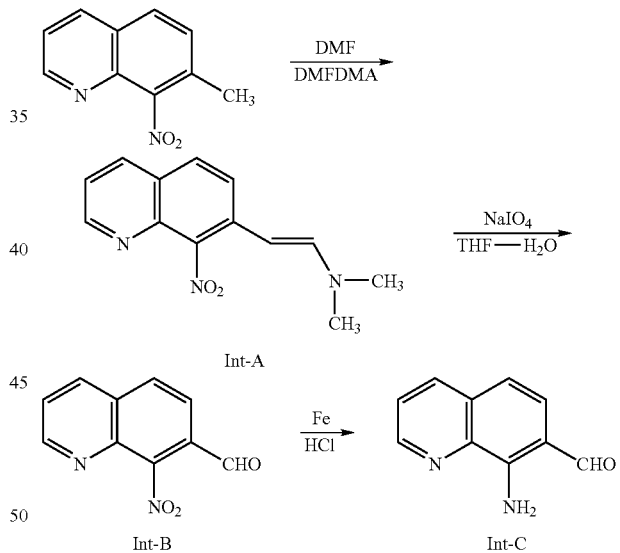

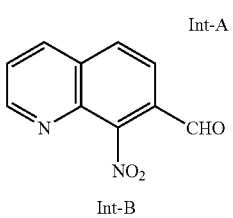

Int-B

Int-C

Another route to synthesize compounds of the present invention is depicted in Scheme 3. Starting with a halogenated phenanthroline derivative (Int-D), one is able to use conditions as described by Williams et al. (*New J. Chem.*), 25, 1136-1146, (2001) to first synthesize a boronate ester (Int-E), which is then hydrolyzed to give a boronic acid (Int-F). Well-known Suzuki coupling between Int-F and a halogenated anthracene (Int-G) derivative yields compounds of the present invention (Prod-2). Prod-2 may be further functionalized using various synthetic techniques to yield compounds with desirable properties. Anthracene derivatives containing at least one halogen group are either commercially available or can be synthesized by one skilled in the art.

Scheme 3
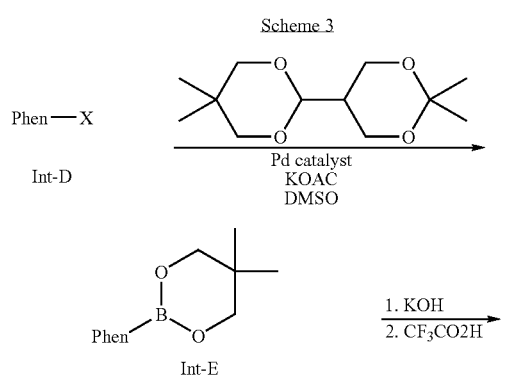
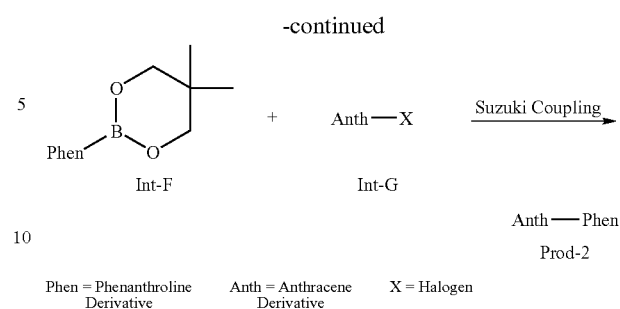
Phen = Phenanthroline Derivative    Anth = Anthracene Derivative    X = Halogen
Illustrative, non-limiting examples of inventive compounds are listed below.
Inv-1
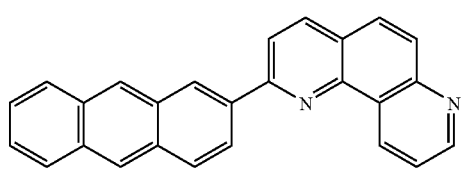
Inv-2
Inv-3
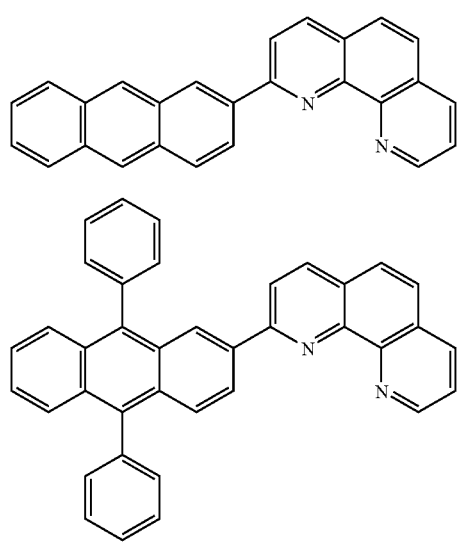
Inv-4
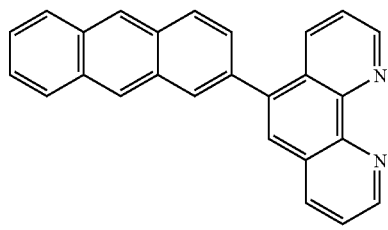
Inv-5
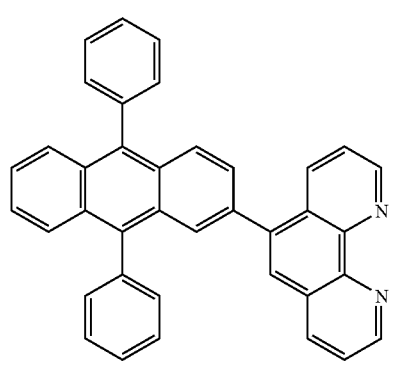
Inv-6
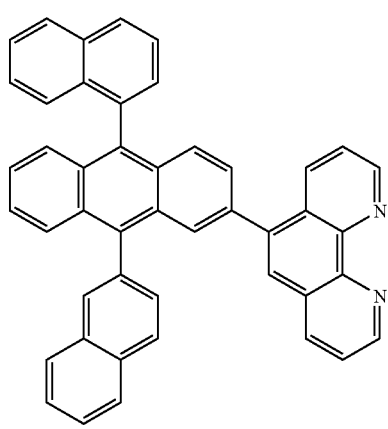

-continued
Inv-7
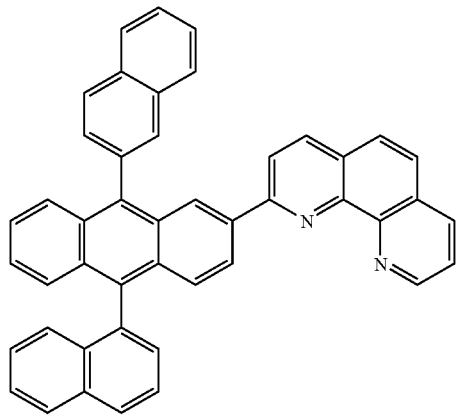
Inv-8
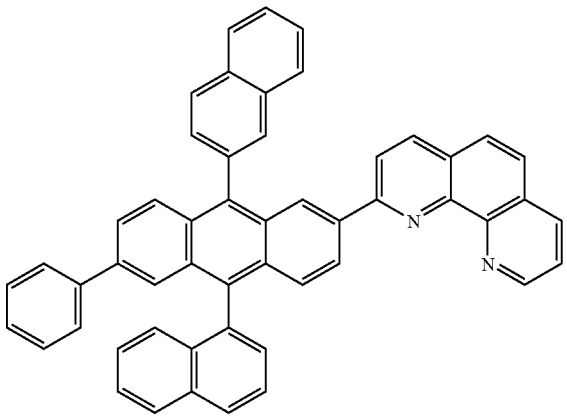
Inv-9
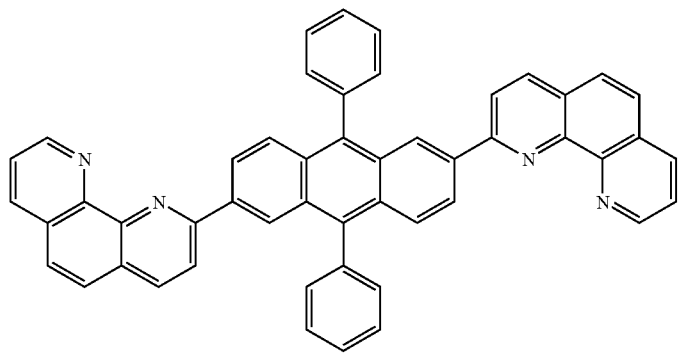
Inv-10
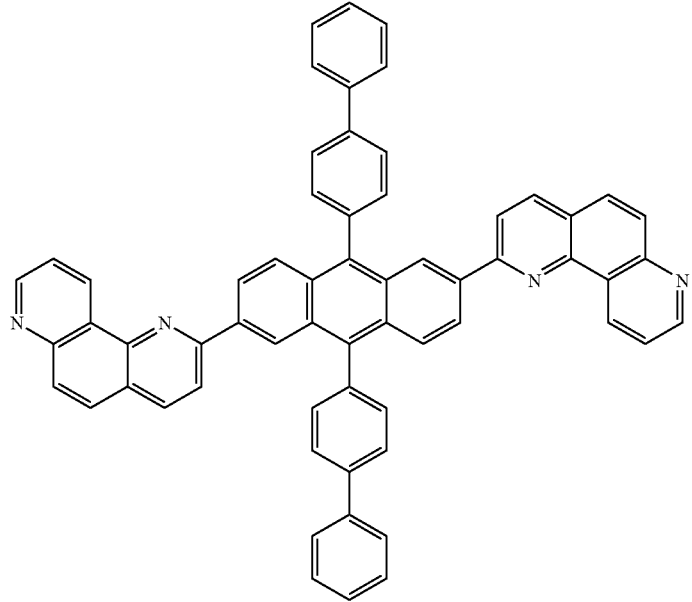

-continued
Inv-11
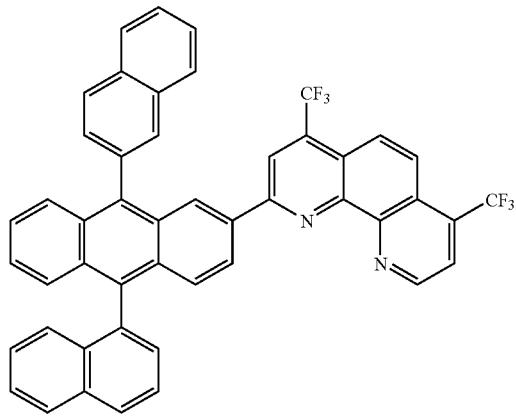
Inv-12
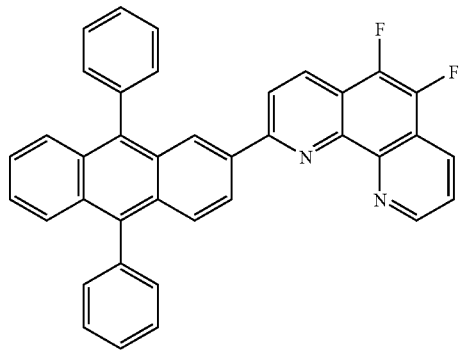
Inv-13
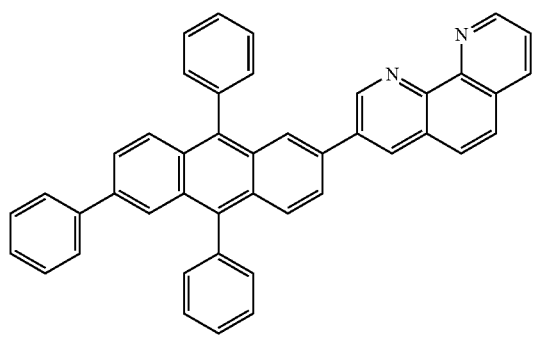
Inv-14
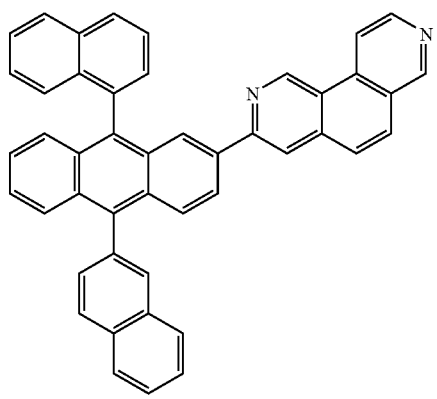
Inv-15
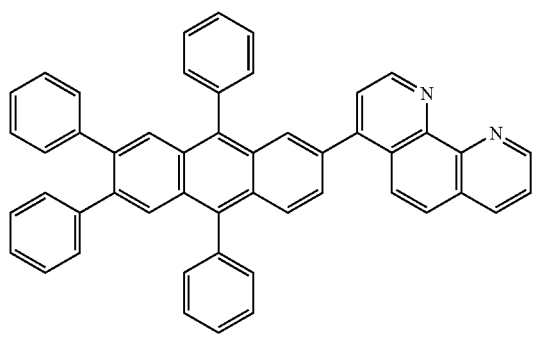
Inv-16
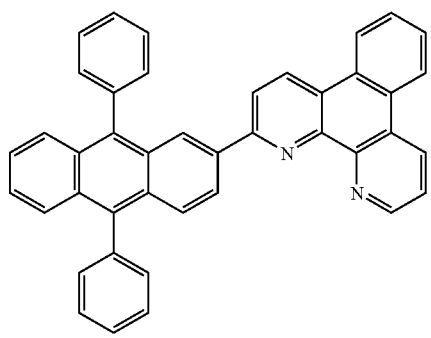
Inv-17
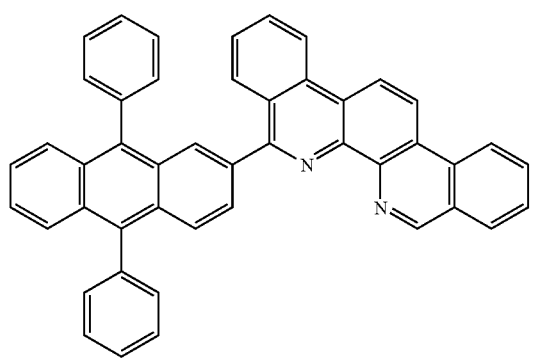
Inv-18
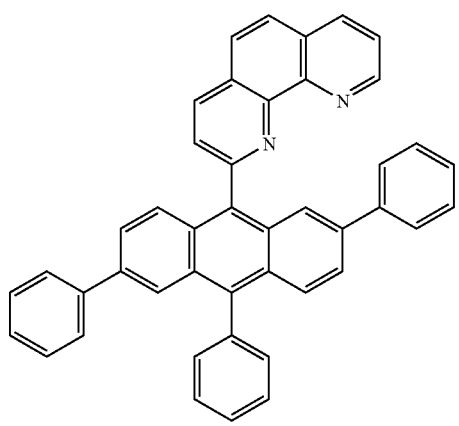

-continued
Inv-19
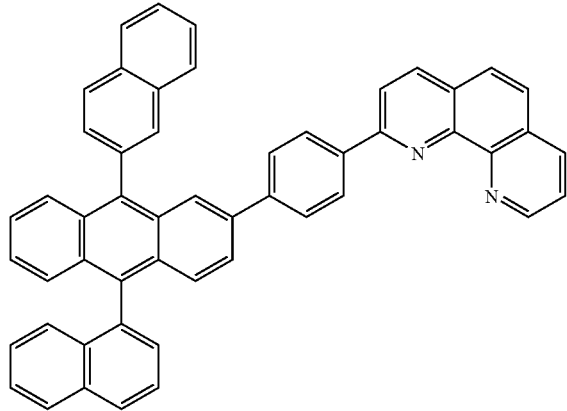
Inv-20
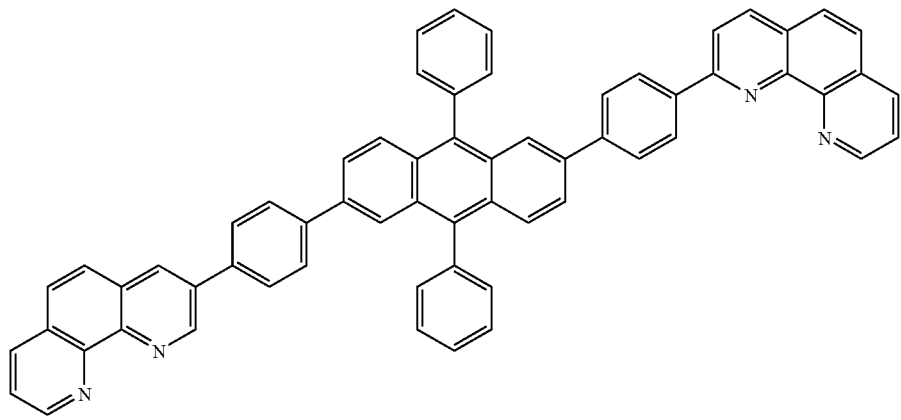
Inv-21
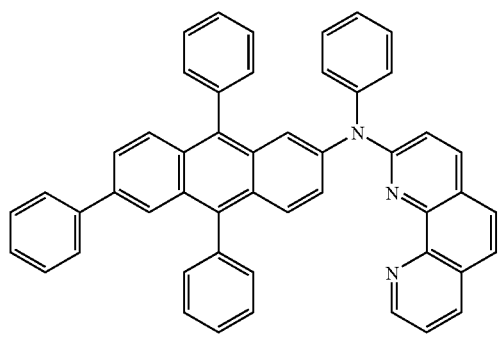
Inv-22
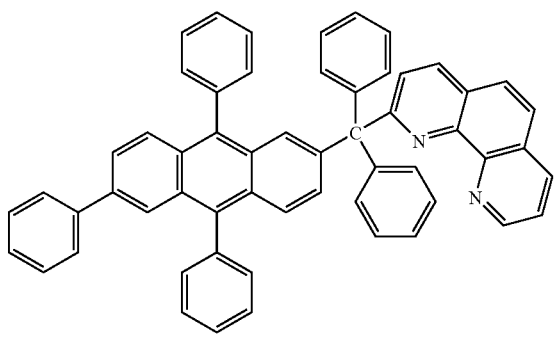

-continued
Inv-23
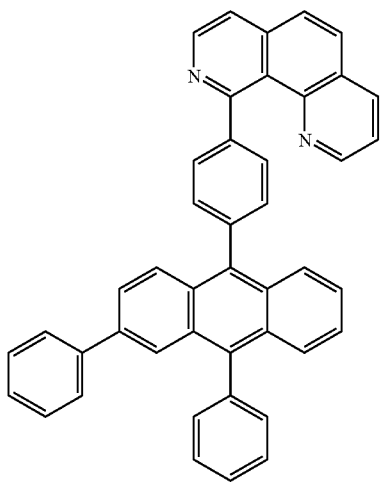
Inv-24
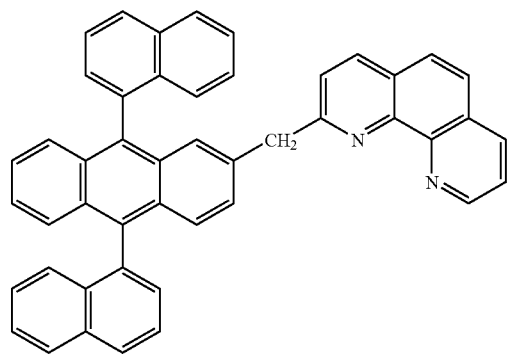
Inv-25
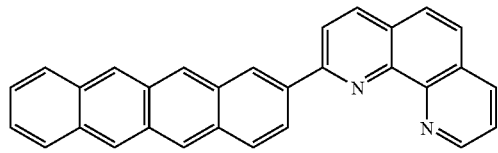
Inv-26
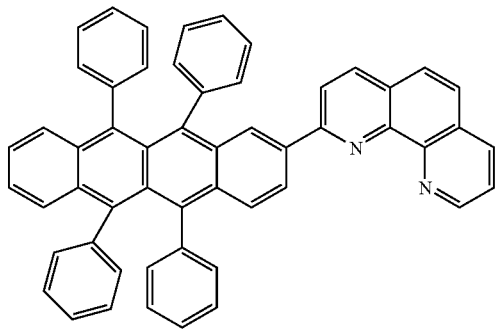
Inv-27
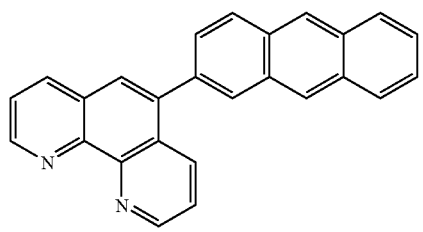
Inv-28
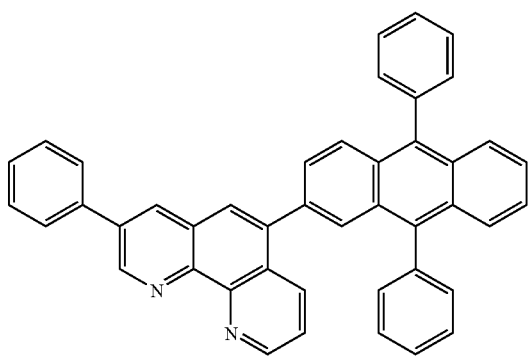

-continued
Inv-29
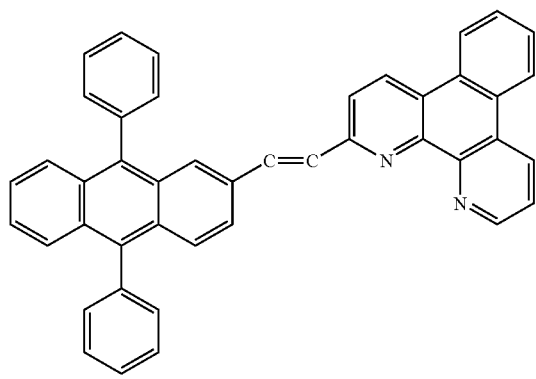
Inv-30
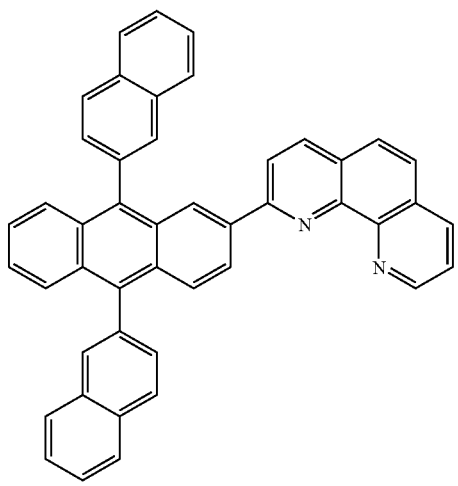
Inv-31
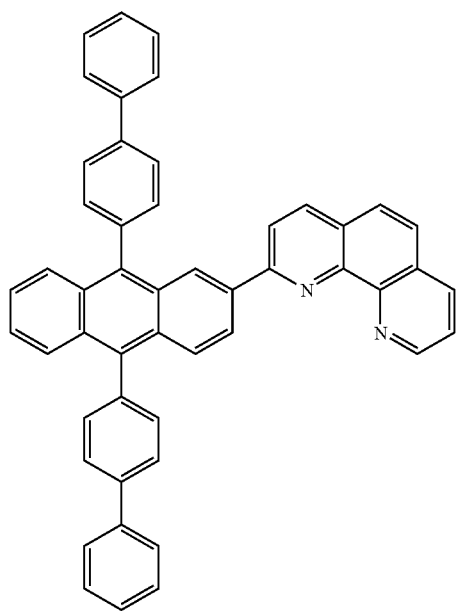
Inv-32
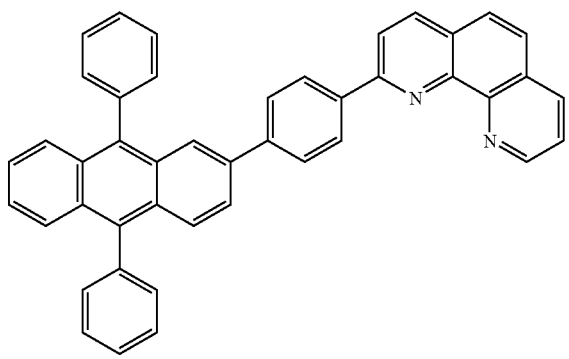
Inv-33
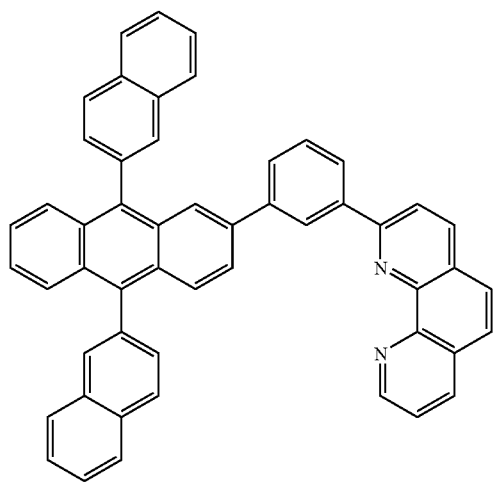
Inv-34
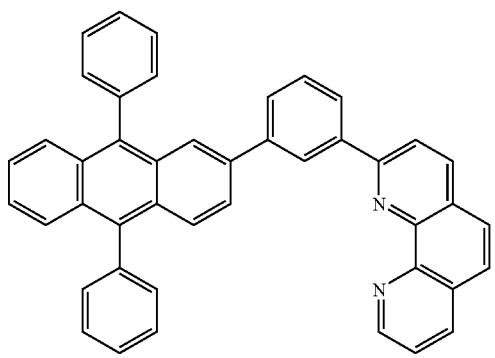

-continued
Inv-35
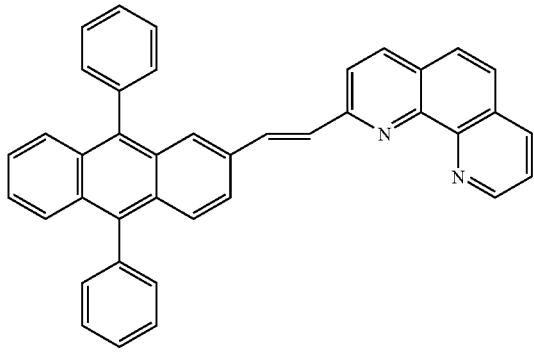
Inv-36
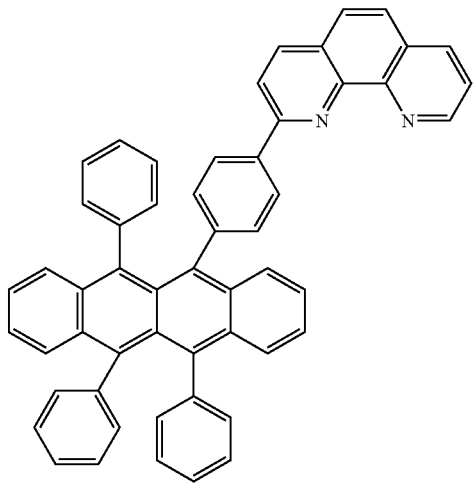
Inv-37
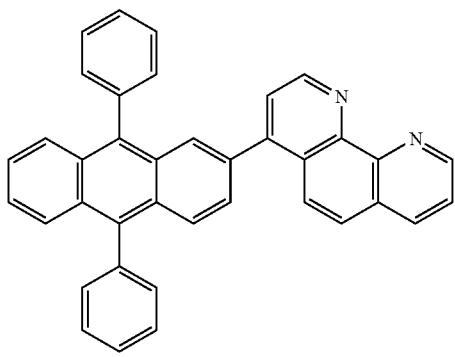
Inv-38
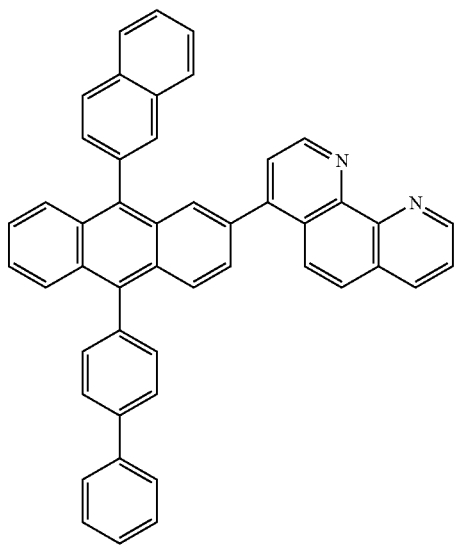
Inv-39
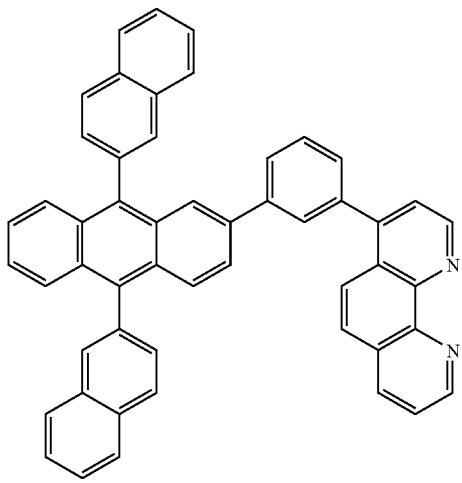

Unless otherwise specifically stated, use of the term "substituted" or "substituent" means any group or atom other than hydrogen. Additionally, unless otherwise specifically stated, when a compound with a substitutable hydrogen is identified or the term "group" is used, it is intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonyl amino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl) ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, $12^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in the FIGURE and is comprised of a substrate 101, an anode 103, a hole-injecting layer 105, a hole-transporting layer 107, a light-emitting layer 109, an electron-transporting layer 111, an electron-injecting layer 112, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4''-tris[(3-methylphenyl)phenylamino]triphenylamine). Alternative hole-injecting materials reportedly useful in organic EL devices are described in EP 0891121 and EP1029909.

Additional useful hole-injecting materials are described in U.S. Pat. No. 6,720,573. For example, the material below may be useful for such purposes.

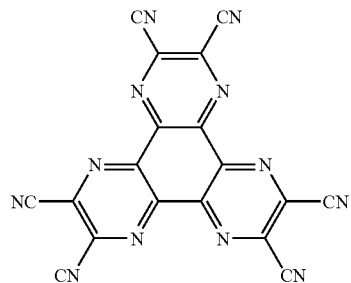

Hole-Transporting Layer (HTL)

The hole-transporting layer 107 of the organic EL device contains at least one hole-transporting compound, such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

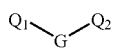

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

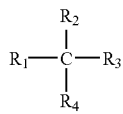

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

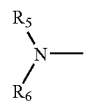

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

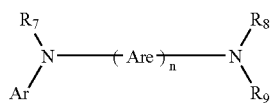

D wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane (TAPC)
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1

009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination in this region. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

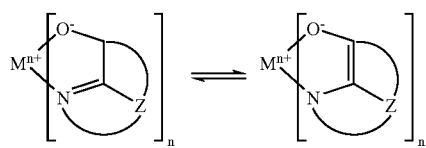

E wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III); Alq]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Derivatives of anthracene (Formula F) constitute one class of useful host materials capable of supporting electroluminescence, and are particularly suitable for light emission of wavelengths longer than 400 nm, e.g., blue, green, yellow, orange or red. Asymmetric anthracene derivatives as disclosed in U.S. Pat. No. 6,465,115 and WO 2004/018587 are also useful hosts.

F

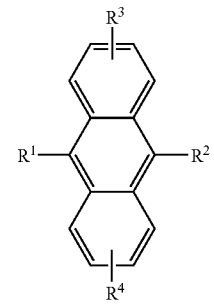

wherein:
$R^1$ and $R^2$ represent independently selected aryl groups, such as naphthyl, phenyl, biphenyl, triphenyl, anthracene.
$R^3$ and $R^4$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;

Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine or cyano.

A useful class of anthracenes are derivatives of 9,10-di-(2-naphthyl)anthracene (Formula G).

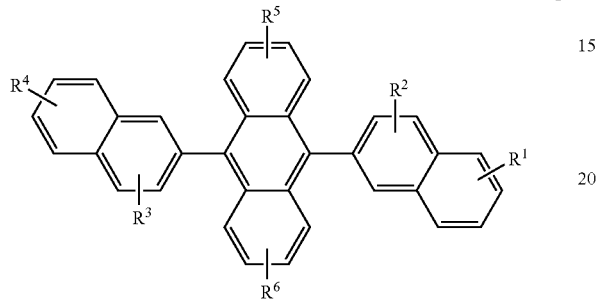

G wherein: $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine or cyano.

Illustrative examples of anthracene materials for use in a light-emitting layer include: 2-(4-methylphenyl)-9,10-di-(2-naphthyl)-anthracene; 9-(2-naphthyl)-10-(1,1'-biphenyl)-anthracene; 9,10-bis[4-(2,2-diphenylethenyl)phenyl]-anthracene, as well as the following listed compounds.

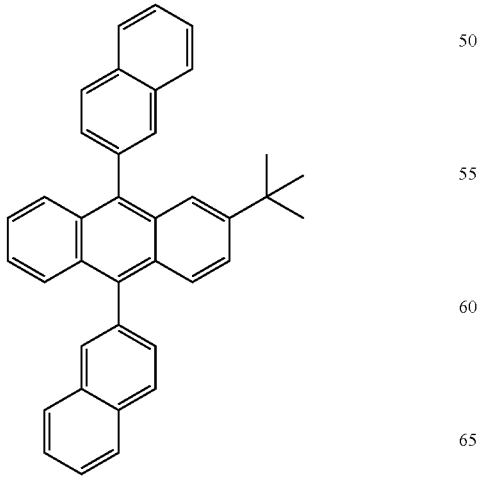

-continued

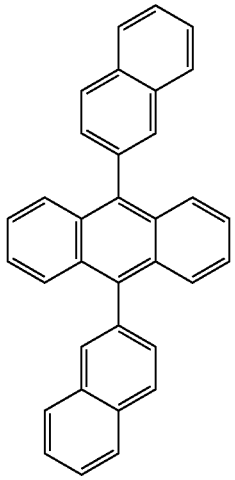

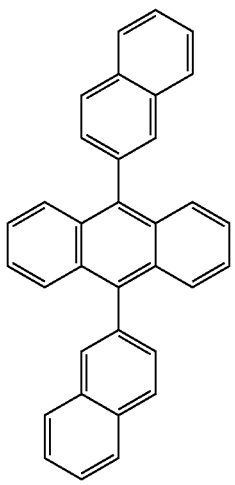

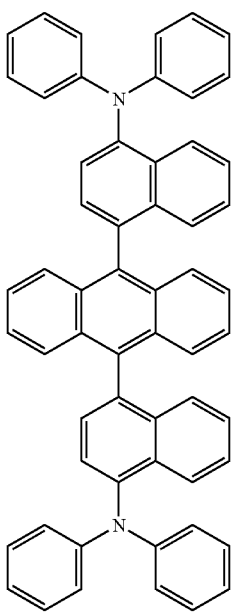

33
-continued
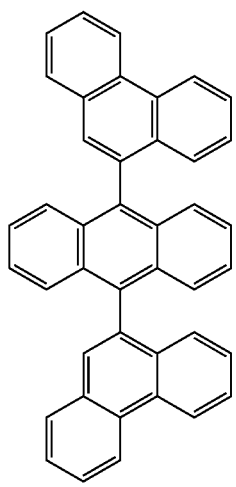
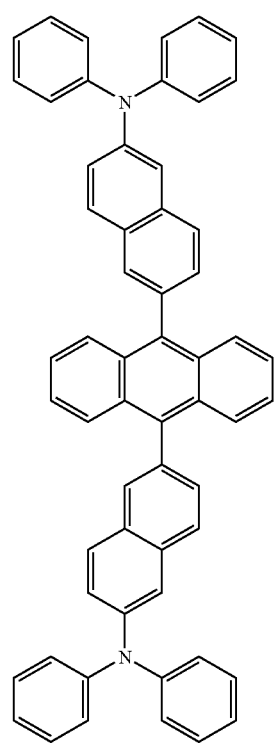
34
-continued
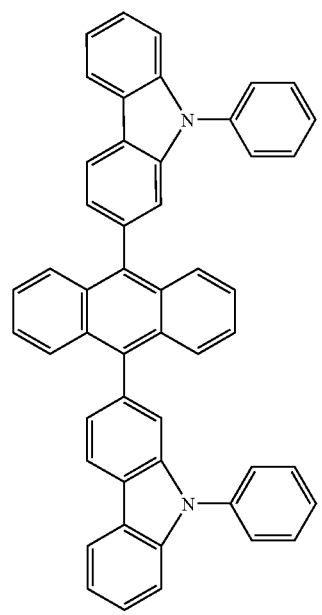
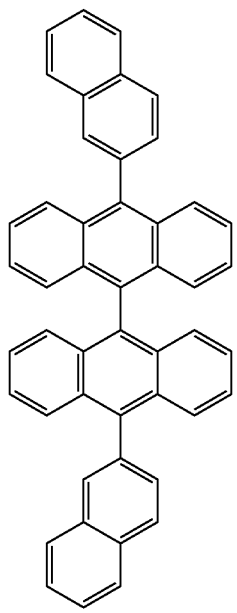

-continued

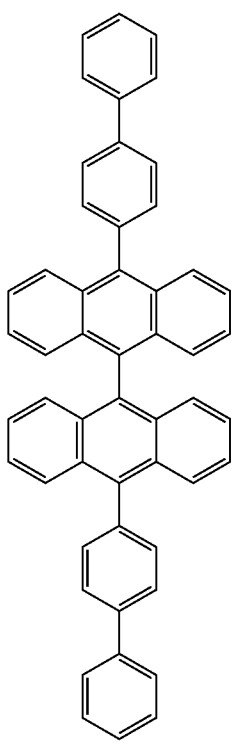

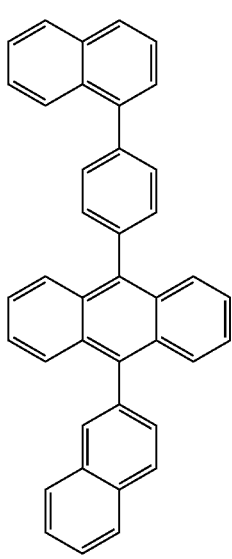

-continued

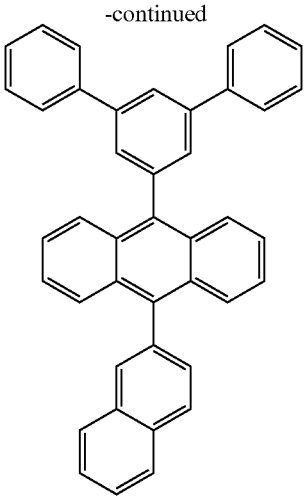

Benzazole derivatives (Formula H) constitute another class of useful host materials capable of supporting electroluminescence, and are particularly suitable for light emission of wavelengths longer than 400 nm, e.g., blue, green, yellow, orange or red.

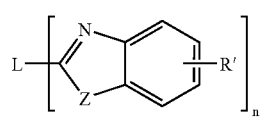

H

Where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Distyrylarylene derivatives are also useful hosts, as described in U.S. Pat. No. 5,121,029. Carbazole derivatives are particularly useful hosts for phosphorescent emitters.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Examples of useful phosphorescent materials are reported in WO 00/57676, WO 00/70655, WO 01/41512, WO 02/15645, US 2003/0017361, WO 01/93642, WO 01/39234, U.S. Pat. No. 6,458,475, WO 02/071813, U.S. Pat. No. 6,573,651, US 2002/0197511, WO 02/074015, U.S. Pat. No. 6,541, 455, US 2003/0072964, US 2003/0068528, U.S. Pat. No. 6,413,656, U.S. Pat. No. 6,515,298, U.S. Pat. No. 6,451,415, U.S. Pat. 6,097,147, US 2003/0124381, US 2003/0059646, US 2003/0054198, EP 1 239 526, EP 1 238 981, EP 1 244 155, US 2002/0100906, US 2003/0068526, US 2003/0068535, JP 2003073387, JP 2003073388, US 2003/0141809, US 2003/0040627, JP 2003059667, JP 2003073665, and US 2002/0121638.
Illustrative examples of useful fluorescent and phosphorescent emitting materials include, but are not limited to, the following:
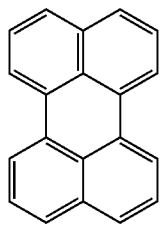
L1
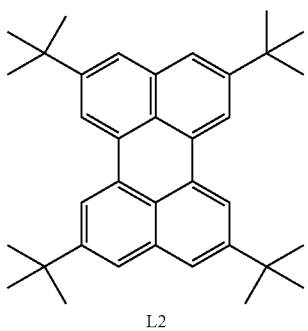
L2
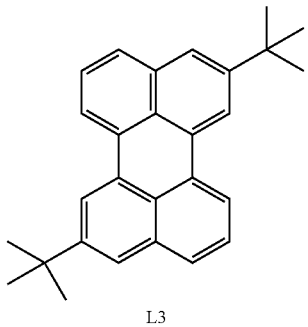
L3
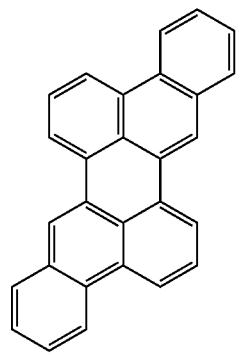
L4
-continued
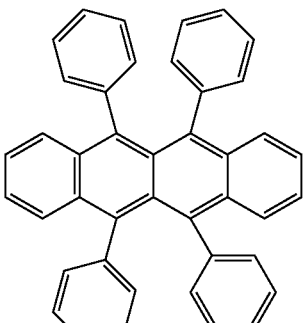
L5
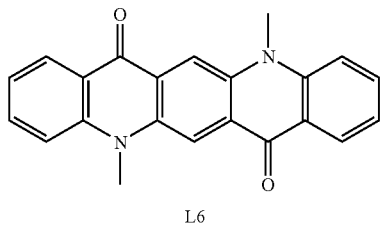
L6
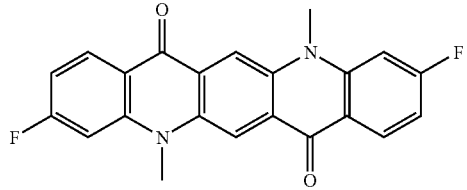
L7
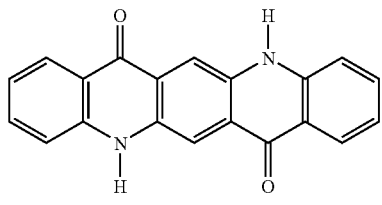
L8
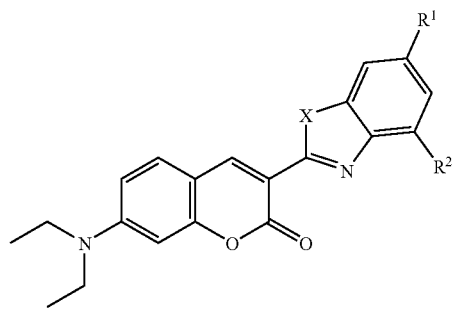

-continued

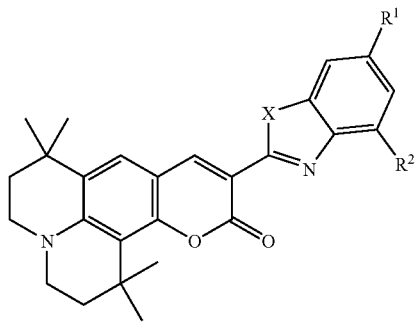

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

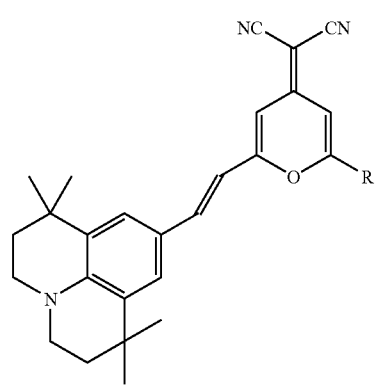

-continued

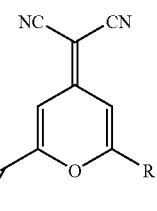

| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |

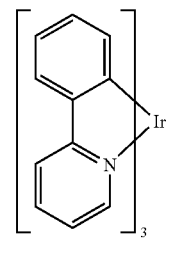

L45

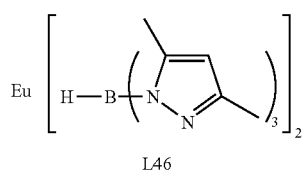

L46

-continued
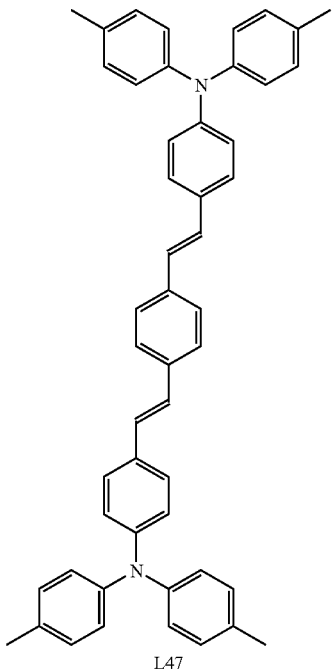
L47
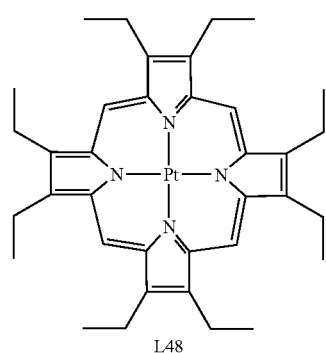
L48
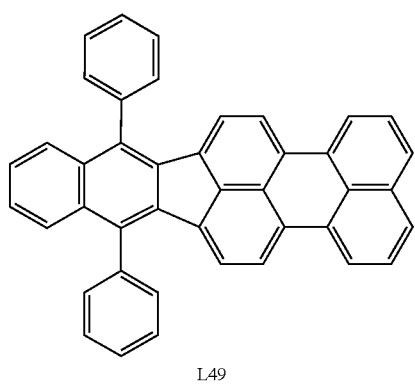
L49
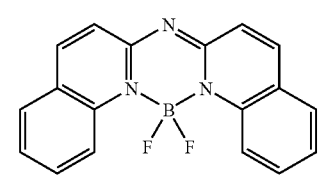
L50
-continued
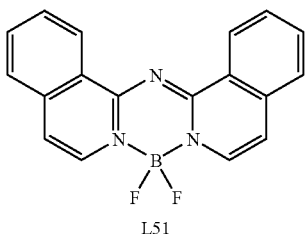
L51
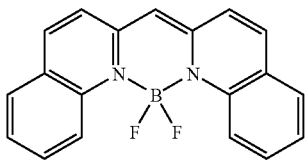
L52
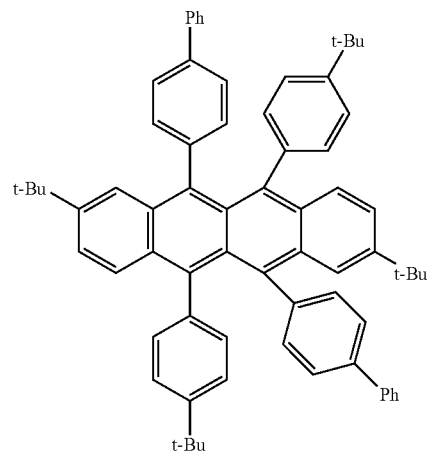
L53
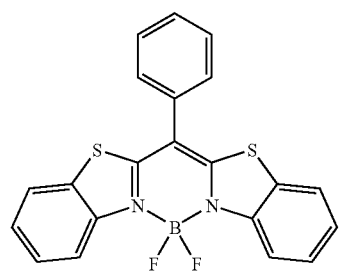
L54

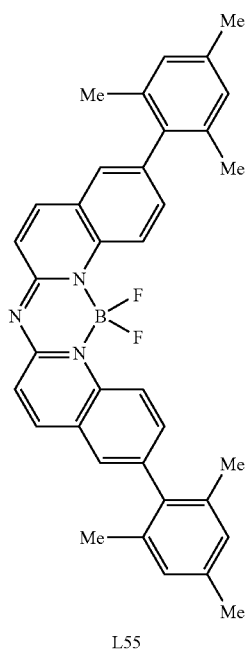

L55

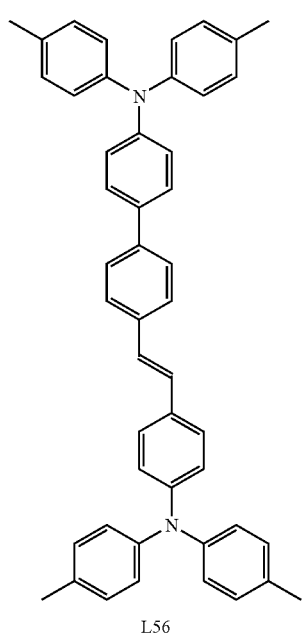

L56

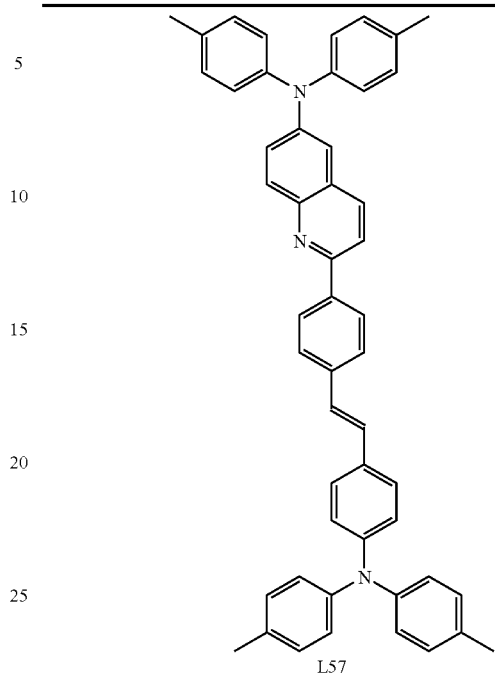

L57

Electron-Transporting Layer (ETL)

In one embodiment the anthracene compound is included in an electron-transporting layer. Additional electron-transporting layers maybe present. Preferred thin film-forming materials for use in forming the additional electron-transporting layer of the organic EL devices of this invention include metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (H) are also useful electron transporting materials. Triazines are also known to be useful as electron transporting materials. Further useful materials are silacyclopentadiene derivatives described in EP 1,480,280; EP 1,478,032; and EP 1,469,533. Substituted 1,10-phenanthroline compounds such as are disclosed in JP2003-115387; JP2004-311184; JP2001-267080; and WO2002-043449. Pyridine derivatives are described in JP2004-200162 as useful electron transporting materials.

Electron-Injecting Layer (EIL)

Electron- injecting layers, when present, include those described in U.S. Pat. Nos. 5,608,287; 5,776,622; 5,776,623; 6,137,223; and 6,140,763, 6,914,269 the disclosures of which are incorporated herein by reference. An electron-injecting layer generally consists of a material having a work function less than 4.0 eV. A thin-film containing low work-function alkaline metals or alkaline earth metals, such as Li, Cs, Ca, Mg can be employed. In addition, an organic material doped with these low work-function metals can also be used effectively as the electron-injecting layer. Examples are Li— or Cs-doped Alq. In one suitable embodiment the electron-injecting layer includes LiF. In practice, the electron-injecting layer is often a thin layer deposited to a suitable thickness in a range of 0.1-3.0 nm.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182 and may be equipped with a suitable filter arrangement to produce a color emission.

Additional layers such as electron or hole-blocking layers as taught in the art may be employed in devices of this invention. Hole-blocking layers may be used between the light emitting layer and the electron transporting layer. Electron-blocking layers may be used between the hole-transporting layer and the light emitting layer. These layers are commonly used to improve the efficiency of emission, for example, as in US 20020015859.

This invention may be used in so-called stacked device architecture, for example, as taught in U.S. Pat. Nos. 5,703,436 and 6,337,492.

Deposition of Organic Layers

The organic materials mentioned above are suitably deposited by any means suitable for the form of the organic materials. In the case of small molecules, they are conveniently deposited through sublimation, but can be deposited by other means such as from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. Nos. 10/784,585; 10/805,980; 10/945,940; 10/945,941; 11/050,924; and 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

EXAMPLE 1

Synthesis of Inv-1
[2-(2-anthracenyl)-1,10-phenanthroline]

A mixture of 8-amino-7-quinolinecarbaldehyde (Int-C, Scheme I, 1.6 g, 9.1 mmol), 2-acetylanthracene (2.0 g, 9.1 mmol) and anhydrous ethanol (500 ml) was placed into a round-bottom flask under a nitrogen atmosphere. Saturated ethanolic potassium hydroxide (9.5 ml) was added dropwise. The mixture was then heated to reflux for 3 days, during which time a brown precipitate formed. The reaction was cooled to room temperature and the solid was collected by filtration and washed well with ethanol (100 ml) and hexanes (100 ml). Thin layer chromatography (Baker-flex® Aluminum Oxide IB-F) of the collected solid using methylene chloride as eluent showed the solid to be pure. The collected solid was sublimed twice at 265° C. to yield 2.7 g (83% yield) of orange solid, which was confirmed to be 2-(2-anthracenyl)-1,10-phenanthroline (Inv-1) by FD-Mass Spectrometry. FD-MS (m/z): 356.

EXAMPLE 2

Fabrication of Device 1-1, 1-2, and 1-3

Device 1-1, 1-2, and 1-3 were prepared in the following manner. A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:
  a) a hole-transporting layer of either 75 nm or 95 nm (see Table 1) of N,N'-di(1-naphthyl)-N,N'-diphenyl-4,4'-diaminobiphenyl (NPB);
  b) a 20 nm light-emitting layer including host 9-(4-biphenyl)-10-(2-naphthyl)anthracene (98.8% by volume) and dopant L55 as the light emitting material (1.2% by volume);
  c) a 40 nm electron transport layer (ETL) including Alq, Inv-1, or C-1 as shown in Table 1;
  e) 0.5 nm layer of lithium fluoride was vacuum deposited onto the ETL, followed by a 121 nm layer of aluminum, to form a cathode layer.

Following that the device was encapsulated in a nitrogen atmosphere along with calcium sulfate as a desiccant.

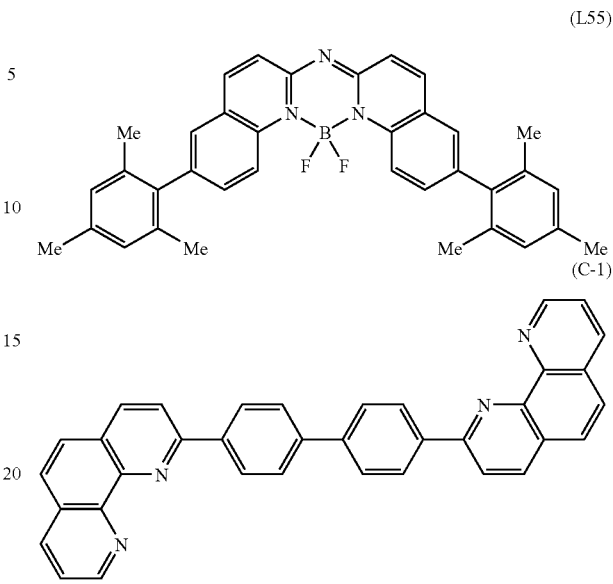

Devices 1-1, 1-2, and 1-3 were tested for voltage (V), luminance yield (cd/A), and efficiency (W/A) at a constant current of 20 mA/cm². Efficiency is the radiant flux (in watts) produced by the device per amp of input current, where radiant flux is the light energy produced by the device per unit time. Testing also determined the color of light produced by the devices, in CIEx, CIEy (Commission Internationale de L'Eclairage) coordinates. Devices 1-1, 1-2, and 1-3 were found to afford light having similar color coordinates (CIEx, y) of 0.15, 0.17; 0.14, 0.15; and 0.15, 0.15 respectively.

Device lifetime ($T_{50}$), which is the time required for the initial luminance to drop by 50%, was measured at room temperature using AC current with average value of 80 mA/cm (fixed current density 160 mA/cm2 in forward bias, alternating with a fixed voltage (−14 V) in reverse bias, each half cycle lasting 0.5 ms). Device performance results are reported in Table 1.

TABLE 1

Performance of Device 1-1, 1-2, and 1-3.

| Device | Example | ETL | NPB Layer (nm) | Volt. (V) | Lum. Yield (Cd/A) | Eff. (W/A) | Lifetime ($T_{50}$, hrs) |
|---|---|---|---|---|---|---|---|
| 1-1 | Comparative | Alq | 95 | 7.9 | 3.50 | 0.070 | 450 |
| 1-2 | Comparative | C-1 | 75 | 5.3 | 4.24 | 0.093 | 100 |
| 1-3 | Inventive | Inv-1 | 75 | 5.2 | 4.58 | 0.098 | 250 |

It can be seen from Table 1 that the inventive device (1-3) affords much higher luminance and significantly lower voltage than the comparative device (1-1), which uses the conventional electron-transporting material, Alq. The inventive device also has a small advantage in luminance output relative to the comparative device (1-2), as well as a slightly lower drive voltage. Inventive device (1-3) has a very large lifetime advantage relative to device (1-2).

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting Layer (HTL)
109 Light-Emitting layer (LEL)
111 Electron-Transporting layer (ETL)
112 Electron-Injecting layer (EIL)
113 Cathode
150 Power Source
160 Conductor

The invention claimed is:

1. An OLED device comprising a cathode, an anode, and a light-emitting layer therebetween, additionally comprising a layer between the cathode and the light-emitting layer including a compound comprising one and only one anthracene nucleus and one and only one phenanthroline-containing substituent and wherein said nucleus is substituted in the 2 position with a phenanthroline-containing substituent wherein the compound is represented by Formula (1a) or Formula (1b):

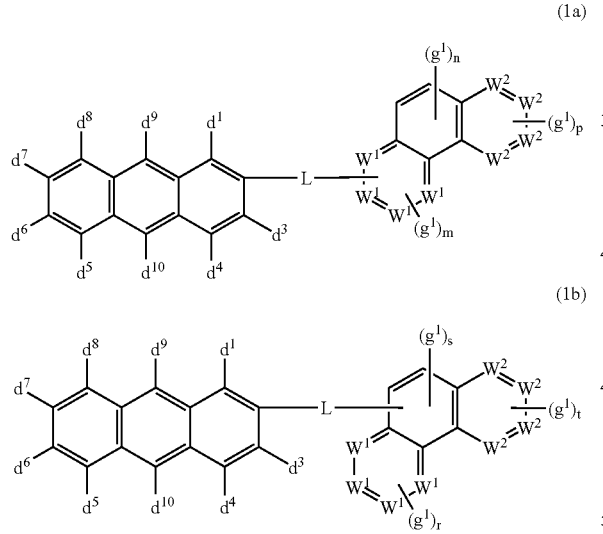

wherein:
d$^1$ and d$^3$-d$^{10}$ may be the same or different and each represents hydrogen or an independently selected substituent, provided two substituents may combine to form a fused ring group;
L represents a bond or a divalent linking group;
each W$^1$ represents CH or N, provided one and only one of W$^1$ represents N;
each W$^2$ represents CH or N, provided one and only one of W$^2$ represents N;
each g$^1$ may be the same or different and each represents an independently selected substituent;
p, r, and t are independently 0-3;
m and n are independently 0-2; and
s is 0 or 1.

2. The device of claim 1 wherein a phenanthroline-containing substituent is directly bonded to the anthracene nucleus.

3. The device of claim 1 wherein a phenanthroline-containing substituent is bonded to the anthracene nucleus by means of a divalent linking group.

4. The device of claim 1 wherein the anthracene nucleus is substituted with independently selected aromatic groups in the 9- and 10-positions.

5. The device of claim 1 wherein d$^9$ and d$^{10}$ represent independently selected aromatic groups.

6. The device of claim 3 wherein L comprises one or more methylene groups.

7. The device of claim 1 wherein the compound is represented by Formula (1c) or Formula (1d):

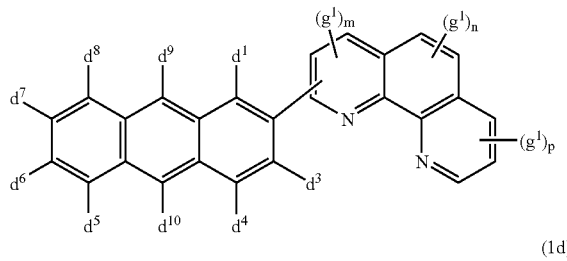

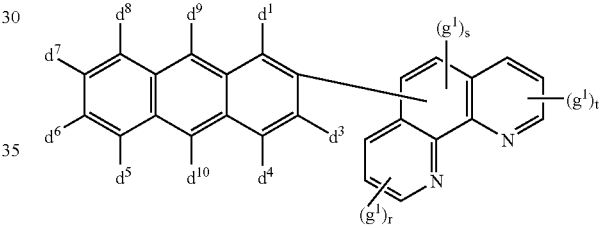

wherein:
d$^1$ and d$^3$-d$^{10}$ may be the same or different and each represents hydrogen or an independently selected substituent, provided two substituents may combine to form a fused ring group;
each g$^1$ may be the same or different and each represents an independently selected substituent;
p, r, and t are independently 0-3;
m and n are independently 0-2; and
s is 0 or 1.

8. The device of claim 1 wherein the compound is represented by Formula (1e):

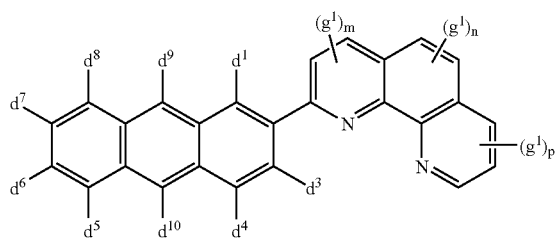

wherein:
d$^1$ and d$^3$-d$^{10}$ may be the same or different and each represents hydrogen or an independently selected substituent, provided two substituents may combine to form a fused ring;
each g$^1$ may be the same or different and each represents an independently selected substituent;

p is 0-3; and m and n are independently 0-2.

9. An OLED device according to claim 1 provided the compound does not include a substituent comprising Si.

* * * * *